(12) United States Patent
Stockstad et al.

(10) Patent No.: US 8,483,985 B2
(45) Date of Patent: Jul. 9, 2013

(54) PLL LOOP BANDWIDTH CALIBRATION

(75) Inventors: Troy Stockstad, Chandler, AZ (US); Tracy Hall, Chandler, AZ (US)

(73) Assignee: QUALCOMM, Incorporated, San Diego, CA (US)

( * ) Notice: Subject to any disclaimer, the term of this patent is extended or adjusted under 35 U.S.C. 154(b) by 932 days.

(21) Appl. No.: 11/962,016

(22) Filed: Dec. 20, 2007

(65) Prior Publication Data

US 2008/0164918 A1 Jul. 10, 2008

Related U.S. Application Data

(60) Provisional application No. 60/883,749, filed on Jan. 5, 2007.

(51) Int. Cl.
*G06F 19/00* (2011.01)

(52) U.S. Cl.
USPC .............................................. 702/85

(58) Field of Classification Search
USPC .......................................... 702/85, 106, 107
See application file for complete search history.

(56) References Cited

U.S. PATENT DOCUMENTS

| | | | | |
|---|---|---|---|---|
| 6,049,255 A * | 4/2000 | Hagberg et al. | | 331/17 |
| 6,121,844 A * | 9/2000 | Suzuki | | 331/17 |
| 6,522,206 B1 * | 2/2003 | Kornblum et al. | | 331/1 A |
| 6,891,414 B1 * | 5/2005 | Bunch et al. | | 327/156 |
| 2003/0001681 A1 * | 1/2003 | Asikainen et al. | | 331/18 |
| 2005/0046487 A1 * | 3/2005 | Vilhonen et al. | | 331/17 |
| 2005/0073369 A1 * | 4/2005 | Balboni et al. | | 331/16 |
| 2005/0271137 A1 * | 12/2005 | Kolze et al. | | 375/233 |
| 2006/0049878 A1 | 3/2006 | Kawabe et al. | | |
| 2007/0057737 A1 * | 3/2007 | Davis et al. | | 331/17 |
| 2008/0074201 A1 * | 3/2008 | Henzler et al. | | 331/17 |
| 2008/0136535 A1 * | 6/2008 | Khorram | | 331/17 |

FOREIGN PATENT DOCUMENTS

| | | |
|---|---|---|
| WO | 9965146 A | 12/1999 |
| WO | 2004023656 A | 3/2004 |

OTHER PUBLICATIONS

Jan Craninckx, A Fully Integrated CMOS DCS-1800 Frequency Synthesizer, Dec. 1998, IEEE Journal of Solid State Curcuit, vol. 33, No. 12, p. 2054-2065.*
International Search Report and Written Opinion for PCT Application No. US2008/050121 dated May 21, 2008, 4 pgs.

* cited by examiner

*Primary Examiner* — Bryan Bui
(74) *Attorney, Agent, or Firm* — William H. Hooks (57) ABSTRACT

Systems and methodologies are described that facilitate calibration of the loop bandwidth of a phase-locked loop (PLL). Calibration for the loop bandwidth of a PLL as described herein can be performed by optimizing the loop response of the PLL. Optimization of the loop response of the PLL can be achieved by modifying the value of a feedback counter of the PLL to induce a loop response at the PLL. The loop response of the PLL can be measured and compared to an ideal loop response. Based on this comparison, appropriate adjustments can be made to the PLL. Further, various techniques described herein facilitate calibration of a PLL by adjusting only parameters of a charge pump of the PLL without requiring individual control mechanisms for each element of the PLL, thereby improving PLL performance and manufacturing yield.

28 Claims, 10 Drawing Sheets

PLL LOOP BANDWIDTH CALIBRATION

CROSS-REFERENCE

This application claims the benefit of priority from U.S. Provisional Patent Application Ser. No. 60/883,749, filed Jan. 5, 2007 and entitled "PLL LOOP BANDWIDTH CALIBRATION," which is fully incorporated herein by reference for all purposes.

BACKGROUND

1. Field

The subject disclosure relates generally to wireless communications, and more specifically to calibration techniques for devices operating in a wireless communication system.

2. Background

Wireless communication systems are widely deployed to provide various communication services; for instance, voice, video, packet data, broadcast, and messaging services may be provided via such wireless communication systems. These systems may be multiple-access systems that are capable of supporting communication for multiple terminals by sharing available system resources. Examples of such multiple-access systems include Code Division Multiple Access (CDMA) systems, Time Division Multiple Access (TDMA) systems, Frequency Division Multiple Access (FDMA) systems, and Orthogonal Frequency Division Multiple Access (OFDMA) systems.

A phase-locked loop (PLL) circuit is often an important component of a device that is designed to operate in a wireless communication system. The performance of a PLL can depend on several factors. For example, the loop bandwidth of a PLL can impact the transient response, integrated phase noise (IPN), residual phase noise (RPN), inter-carrier interference (ICI), and other performance parameters of the PLL. To achieve optimal performance for a PLL, the loop bandwidth of the PLL should be well controlled. Therefore, it is often important to place careful controls on the loop bandwidth.

Unfortunately, the loop bandwidth can be affected by many parameters that are often parasitic and variable in nature as a result of process variations. Reasons for these variations include semiconductor process variations, external component variations, and power supply variations. Conventionally, the loop bandwidth of a PLL is controlled by controlling variations of each element or block of the PLL during construction of the PLL. Often, however, this is a complex and unreliable process. Consequentially, there is an unmet need in the art for efficient and reliable techniques for calibrating the loop bandwidth of a PLL.

SUMMARY

The following presents a simplified summary of various aspects of the claimed subject matter in order to provide a basic understanding of such aspects. This summary is not an extensive overview of all contemplated aspects, and is intended to neither identify key or critical elements nor delineate the scope of such aspects. Its sole purpose is to present some concepts of the disclosed aspects in a simplified form as a prelude to the more detailed description that is presented later.

According to an aspect, a method for adjusting a composite loop bandwidth of a phase-locked loop (PLL) is described herein. The method can comprise causing the PLL to exhibit a loop response; measuring the loop response exhibited by the PLL; and adjusting one or more parameters of an element in the PLL to optimize the measured loop response and the composite loop bandwidth of the PLL.

Another aspect relates to a wireless communications apparatus that can comprise a memory that stores data relating to a PLL and a time constant related to loop response of the PLL. The wireless communications apparatus can further include a processor configured to induce a loop response of the PLL, measure the induced loop response, and adjust the time constant of the PLL based at least in part on the induced loop response.

Yet another aspect relates to an apparatus that facilitates calibration of a PLL in a wireless communication system. The apparatus can comprise means for inducing a loop response of the PLL at least in part by modifying one or more parameters relating to a divider in a feedback path of the PLL; means for measuring a response time associated with the loop response of the PLL; and means for adjusting loop bandwidth of the PLL based on the measured response time of the PLL to cause the PLL to operate at a desired loop bandwidth.

Still another aspect relates to a computer-readable medium, which can comprise code for causing a computer to modify a feedback counter of a PLL; code for causing a computer to measure an amount of settling time required by the PLL to settle as a result of the modification of the feedback counter; and code for causing a computer to adjust loop bandwidth of the PLL at least in part by adjusting one or more parameters of an element in the PLL based on the measured amount of settling time.

An additional aspect described herein relates to an integrated circuit that can execute computer-executable instructions for adjusting a loop bandwidth of a PLL. The instructions can comprise tuning a VCO in the PLL to a desired frequency; locking the PLL at the desired frequency; recording a tuning voltage of the VCO associated with the desired frequency; changing a value of a feedback counter of the PLL from a first value to a second value to cause a change in the tuning voltage of the VCO; changing the value of the feedback counter back to the first value and measuring a settling time required by the VCO to return to the recorded tuning voltage; and adjusting a time constant of the PLL based on the measured settling time to provide a desired loop bandwidth for the PLL.

To the accomplishment of the foregoing and related ends, one or more aspects of the claimed subject matter comprise the features hereinafter fully described and particularly pointed out in the claims. The following description and the annexed drawings set forth in detail certain illustrative aspects of the claimed subject matter. These aspects are indicative, however, of but a few of the various ways in which the principles of the claimed subject matter may be employed. Further, the disclosed aspects are intended to include all such aspects and their equivalents.

DETAILED DESCRIPTION

Various aspects of the claimed subject matter are now described with reference to the drawings, wherein like reference numerals are used to refer to like elements throughout. In the following description, for purposes of explanation, numerous specific details are set forth in order to provide a thorough understanding of one or more aspects. It may be evident; however, that such aspect(s) may be practiced without these specific details. In other instances, well-known structures and devices are shown in block diagram form in order to facilitate describing one or more aspects.

As used in this application, the terms "component," "module," "system," and the like are intended to refer to a computer-related entity, either hardware, firmware, a combination of hardware and software, software, or software in execution. For example, a component can be, but is not limited to being, a process running on a processor, an integrated circuit, an object, an executable, a thread of execution, a program, a state machine, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

Furthermore, various aspects are described herein in connection with a wireless terminal and/or a base station. A wireless terminal can refer to a device providing voice and/or data connectivity to a user. A wireless terminal can be connected to a computing device such as a laptop computer or desktop computer, or it can be a self contained device such as a personal digital assistant (PDA). A wireless terminal can also be called a system, a subscriber unit, a subscriber station, mobile station, mobile, remote station, access point, remote terminal, access terminal, user terminal, user agent, user device, or user equipment. A wireless terminal can be a subscriber station, wireless device, cellular telephone, PCS telephone, cordless telephone, a Session Initiation Protocol (SIP) phone, a wireless local loop (WLL) station, a personal digital assistant (PDA), a handheld device having wireless connection capability, or other processing device connected to a wireless modem. A base station (e.g., access point) can refer to a device in an access network that communicates over the air-interface, through one or more sectors, with wireless terminals. The base station can act as a router between the wireless terminal and the rest of the access network, which can include an Internet Protocol (IP) network, by converting received air-interface frames to IP packets. The base station also coordinates management of attributes for the air interface.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ).

Various aspects will be presented in terms of systems that can include a number of devices, components, modules, and the like. It is to be understood and appreciated that the various systems can include additional devices, components, modules, etc. and/or can not include all of the devices, components, modules etc. discussed in connection with the figures. A combination of these approaches can also be used.

Figure 1:
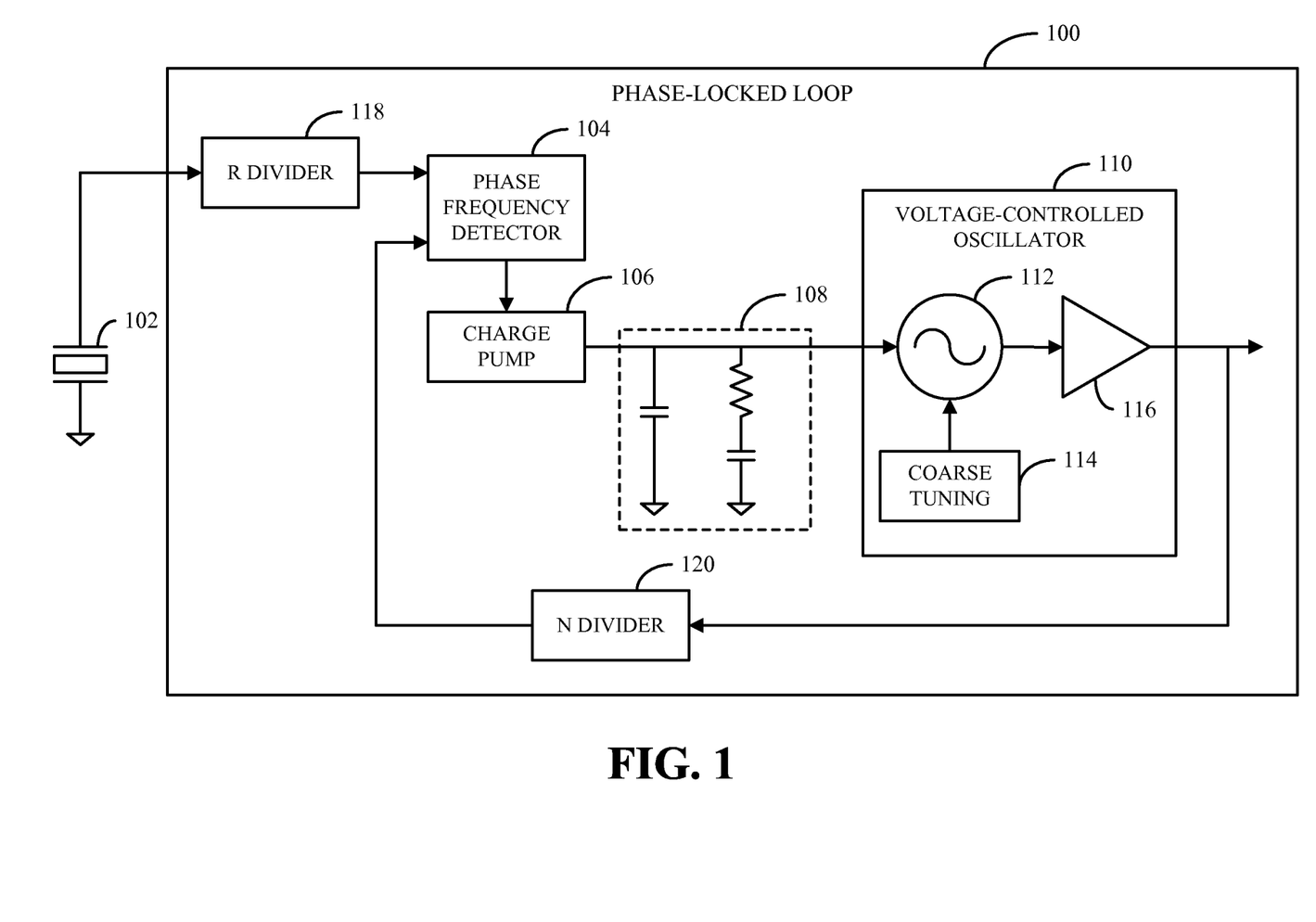
FIG. 1 is a schematic diagram of an example phase-locked loop in accordance with various aspects.

Referring now to the drawings, FIG. 1 is a schematic diagram 100 of an example phase-locked loop (PLL) in accordance with various aspects described herein. In accordance with one aspect, a reference signal with a predetermined frequency can be provided by a crystal oscillator 102 and/or another suitable signal generator, from which PLL 100 can generate an output signal that is fixed (e.g., locked) in frequency and/or phase to the reference signal. In one example, PLL 100 generates signals using a phase frequency detector (PFD) 104, a charge pump 106, a loop filter 108, and a voltage-controlled oscillator (VCO) 110 operating in a closed feedback loop.

In one example, PFD 104 can compare a reference signal provided by an oscillator 102 and/or another suitable signal generator to an output signal provided as feedback from VCO 110. Based on these signals, PFD 104 can determine differences in phase and/or frequency between the signals and express this difference as "pump up" or "pump down" pulses to charge pump 106. Charge pump 106 can then provide charge to the loop filter 108, which filters the charge pump output to the tuning port of VCO 110. By way of specific example, PFD 104 can generate a digital output signal consisting of high and/or low pulses of varying lengths. Charge pump 106 can receive this signal and produce an output corresponding to the pump up and/or pump down signals from PFD 104. The charge pump 106 output can subsequently be filtered by loop filter 108 to provide a stable voltage level to VCO 110.

Upon receiving a signal from charge pump 106 via loop filter 108, VCO 110 can generate an output signal having a frequency based on the voltage level of the input signal provided by loop filter 108. In accordance with one aspect, signal generation at VCO 110 can be performed by an oscillator 112. Further, rough adjustments to oscillator 112 can be made using a coarse tuning module 114 associated with VCO 110. In addition, an amplifier 116 can be utilized at VCO 110 to enable VCO 110 to generate signals of specified amplitude. As PLL 100 further illustrates, signals generated by VCO 110 can be fed back to PFD 104 to complete the feedback loop between PFD 104, charge pump 106, loop filter 108, and VCO 110. In one example, signals generated by VCO 110 can be compared to the reference signal to facilitate continuous adjustment of the output signal of PLL 100 in relation to the reference signal.

In accordance with one aspect, dividers or counters can further be employed within PLL 100 to cause the PLL to generate an output signal having a frequency that is a specified multiple of the frequency of the reference signal provided by oscillator 102 and/or another suitable reference signal source. By utilizing dividers, signals of multiple frequencies can be generated by a PLL 100 based on a single reference signal. In one example, an R divider 118 can be applied to a reference signal prior to comparison at PFD 104, and an N divider 120 can be applied to an output signal from VCO 110 prior to feeding the signal back to PFD 104 for comparison. In such an example, R divider 118 can be configured to generate a signal having a frequency equal to the frequency of the reference signal divided by an integer parameter R, and N divider 120 can be configured to generate a signal having a frequency equal to the frequency of the output signal of VCO 110 divided by an integer parameter N. By doing so, PLL 100 can be configured to generate a signal having a frequency equal to the reference frequency multiplied by N/R.

Figure 2:
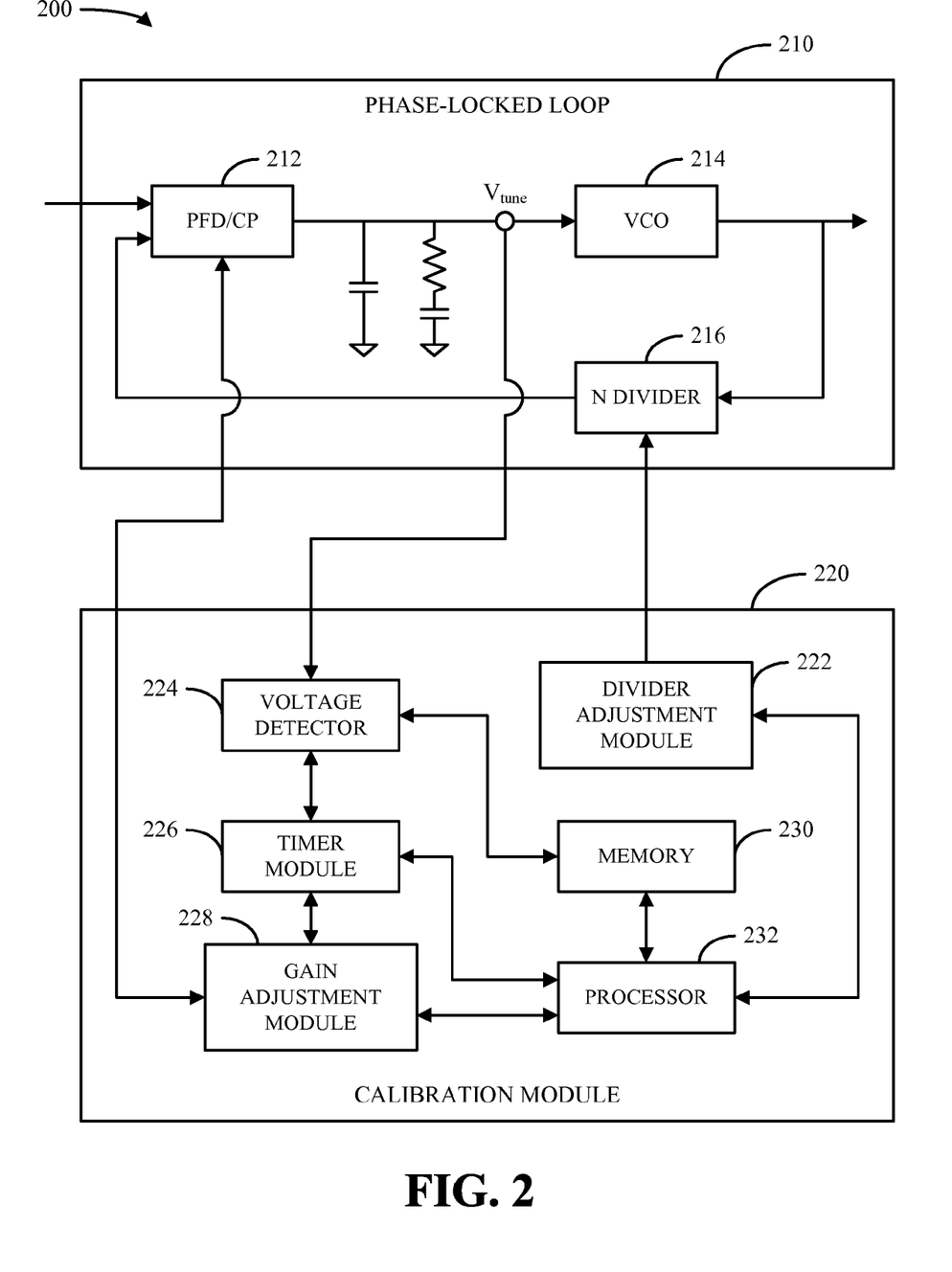
FIG. 2 is a block diagram of a system for calibrating loop bandwidth of a phase-locked loop in accordance with various aspects.

FIG. 2 is a block diagram of a system 200 for calibrating loop bandwidth of a PLL 210 in accordance with various aspects. While FIG. 2 and the following description illustrate and describe calibration for a PLL having a specified configuration, it should be appreciated that FIG. 2 and the following description are provided by way of non-limiting example and that the processes and apparatus described herein can be employed with any suitable variation of PLL and/or synthesizer where it is desired to control loop bandwidth.

In accordance with one aspect, system 200 includes a PLL 210, which can operate using a phase frequency detector and charge pump (PFD/CP) 212, a VCO 214, and an N divider 216 in a similar manner to PLL 100. System 200 can further include a calibration module 220, which can be utilized to perform loop bandwidth calibration for PLL 210. In one example, the loop bandwidth of PLL 210 can affect performance parameters of PLL 210 such as its transient response, integrated phase noise (IPN), residual phase noise (RPN), inter-carrier interference (ICI), and the like. Thus, to enable PLL 210 to perform optimally, calibration module 220 can configure the loop bandwidth of PLL 210. For example, the loop bandwidth of PLL 210 can be adjusted to balance the transient response, ICI performance, IPN, and/or other performance parameters of PLL 210.

Conventionally, controlling the loop bandwidth of a PLL involves controlling variations of each element of the PLL during construction of the PLL. Often, however, this process is prohibitively complex and time-consuming. Further, conventional techniques for PLL loop bandwidth calibration often require controlling individual elements of the PLL during construction of the PLL, thereby making such techniques inapplicable to calibration of a previously-constructed PLL.

Accordingly, calibration module 220 can mitigate the above difficulties of conventional calibration techniques by facilitating calibration of the loop bandwidth of PLL 210 without requiring element-by-element controls. For example, calibration module 220 can calibrate the loop bandwidth of PLL 210 by adjusting a single block in PLL 210. As a result, performance and manufacturing yield for PLL 210 can be improved by eliminating the time and complexity associated with adjusting multiple components in PLL 210. In one example, PLL 210 and/or calibration module 220 can be implemented on one semiconductor device, thereby minimizing the impact of PLL calibration on applications utilizing PLL 210.

In accordance with one aspect, calibration module 220 can calibrate the loop bandwidth of PLL 210 by optimizing the loop response of PLL 210. In one example, the loop response of PLL 210 can be determined by modifying the value of a feedback counter at PLL 210, such as N divider 216, using a divider adjustment module 222 at calibration module 220. More particularly, altering the N divider 216 can cause a change in an output signal that is fed back from VCO 214 to PFD/CP 212, thereby requiring PFD/CP 212 to make adjustments to re-lock PLL 210 based on the new divider value. The loop response of PLL 210 resulting from adjustment of N divider 216 can then be determined at calibration module 220 using a voltage detector 224 and a timer module 226 by, for example, measuring changes to a VCO tuning voltage (e.g., Vtune) over time. Based on the resulting loop response of PLL 210 as determined by voltage detector 224 and timer module 226, the loop bandwidth of PLL 210 can be calibrated by adjusting PFD/CP 212 using a gain adjustment module 228. Accordingly, calibration module 220 can perform loop bandwidth calibration of PLL 210 by performing only adjustment of PFD/CP 212 without requiring individual control mechanisms for each element of PLL 210. As system 200 further illustrates, a memory 230 and a processor 232 can further be provided at calibration module 220 for interacting with various components of calibration module 220 to facilitate efficient operation thereof.

In one example, calibration module 220 can calibrate the loop bandwidth of PLL 210 by adjusting the phase frequency detector gain of PLL 210, denoted herein as $K\phi$, and/or the VCO gain of PLL 210, denoted herein as Kvco. To illustrate the impact of adjustments of $K\phi$ and/or Kvco on the loop bandwidth of PLL 210, the following non-limiting example is provided. An example PLL can be considered that utilizes a multi-band VCO, wherein the loop filter resistor tolerances are 1%, the loop filter capacitor tolerances are 5%, the absolute tolerance of $K\phi$ is 10%, and the VCO has a Kvco variation of approximately 15 MHz/V to 69 MHz/V total or 23 MHz/V to 57 MHz/V within a single band (e.g., 2.5×). This example PLL can be analyzed using an equation-based model, wherein the response time of the loop is defined as the time required for the loop to correct a 500 kHz VCO disturbance. Based on this analysis, it can be determined that the response time of the PLL can experience a variability of as much as 200% of the nominal performance of the PLL if left uncorrected and uncalibrated. Further, it can be determined from this analysis that variations in resistor and capacitor values typically account for only about 9% of this variation, while the remainder is a result of tolerances of $K\phi$ and/or Kvco. Additionally, it should be appreciated that the loop damping coefficients and the natural frequency of the PLL are functions of the resistor values, capacitor values, $K\phi$, and Kvco.

Accordingly, calibration module 220 can calibrate the loop bandwidth of PLL 210 by measuring the "rise time" of the closed loop response of PLL 210. In one example, the rise time of the closed loop response for PLL 210 is illustrated by graph 300 in FIG. 3. In accordance with one aspect, in the event that the value of N divider 216 is changed (e.g., by divider adjustment module 222) at the time marked as t0 in graph 300, the response of Vtune (e.g., as measured by voltage detector 224) can vary as illustrated in graph 300. The response time of PLL from the time on graph 300 marked as t0 to the time on graph 300 marked as t100% can then be calculated (e.g., by timer module 226). In one example, a time at which Vtune returns to the voltage measured at t100% as illustrated in graph 300 can additionally be measured to provide additional information regarding the damping coefficient and natural frequency of PLL 210.

Figure 3:
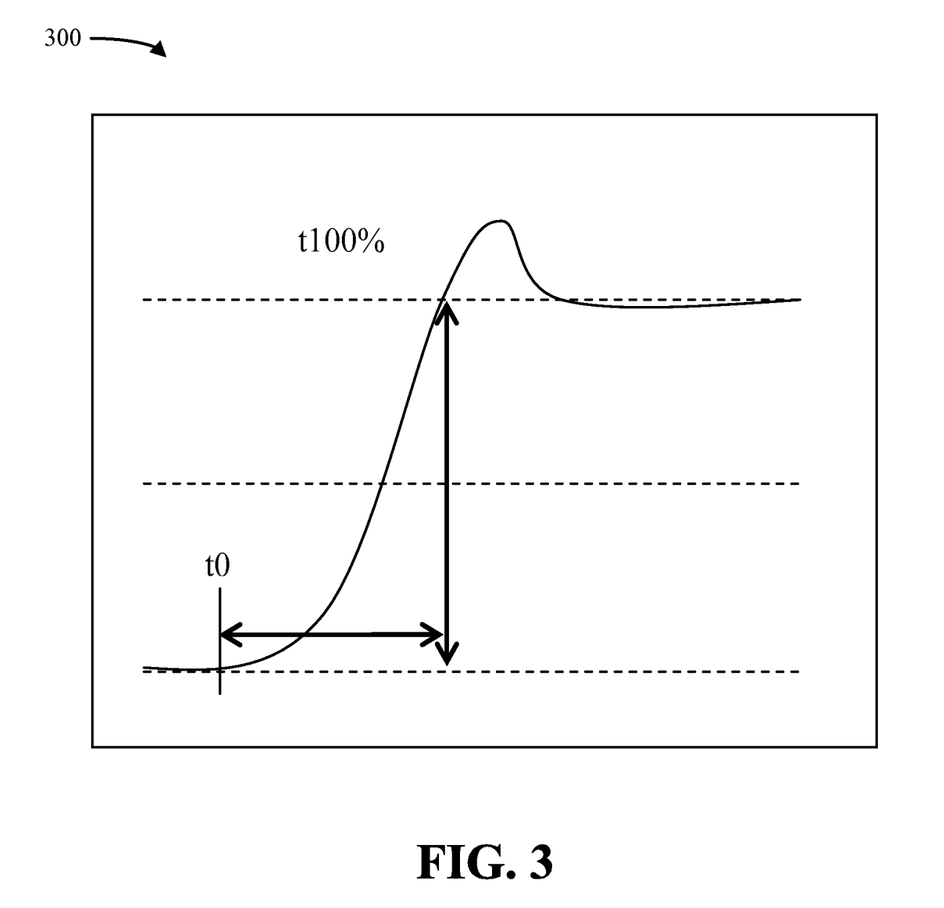
FIGS. 3-4 illustrate example transient response patterns that can be utilized for calibration of a phase-locked loop in accordance with various aspects.

By way of specific, non-limiting example, calibration module 220 can be employed to calibrate PLL 210 for a 130 kHz loop bandwidth nominal target. Based on a Kvco value of 40 MHz/V and a Kφ value of 1.6 mA, the loop response of PLL 210 can have a calculated rise time of 2 µs. Changing the Kvco value to 20 MHz/V and the Kφ value to 3.2 mA, the calculated rise time from t0 to t100% can again be 2 µs. Thus, by measuring the time between t0 and t100% as illustrated by graph 300, calibration module 220 can adjust the loop bandwidth of PLL 210 by varying Kφ (e.g., via gain adjustment module 228).

In another specific example, calibration performed by calibration module 220 can begin by locking VCO 214 at a desired frequency and/or Vtune value and storing the Vtune value in memory 230 as a V100% point corresponding to t100% as illustrated in graph 300. An appropriate offset for N divider 216 can then be selected to cause the difference between V100% and a t0 voltage level to be large enough to allow efficient measurement but small enough to keep the loop response of PLL 210 linear to enable accurate calibration.

In accordance with one aspect, calibration module 220 can calibrate the loop bandwidth of PLL 210 as follows. First, PLL 210 can be tuned and locked to a desired initial frequency. In one example, PLL 210 can be tuned to a desired initial frequency by adjusting a coarse tuning mechanism (e.g., coarse tuning module 114) at VCO 214. In another example, an initial frequency can be chosen such that the value of Vtune does not approach maximum and/or minimum Vtune levels. Next, the Vtune voltage associated with the initial frequency can be measured (e.g., by voltage detector 224) and/or stored electronically by calibration module 220. In one example, the initial Vtune voltage can be stored with sufficient precision to enable subsequent calculations and adjustments to be readily performed. The initial Vtune voltage can be stored as a digital representation using a memory (e.g., memory 230), as an analog representation using a sample and hold circuit or another suitable mechanism, and/or by other appropriate means.

Next, divider adjustment module 222 and/or other suitable means can be employed to adjust N divider 216 to create a small difference in the Vtune voltage. In one example, an adjustment for N divider 216 can be selected as described above such that the difference in the Vtune voltage is small enough to keep Kvco approximately constant and to ensure that PLL 210 behaves linearly but large enough to allow the difference to be measured by voltage detector 224. After adjusting N divider 216 to create a difference in the Vtune voltage, N divider 216 can be adjusted back to its original value to enable the rise time or response time of PLL 210 to be measured by, for example, voltage detector 224 and timer module 226. The effect of one cycle of adjustments to N divider 216 on the Vtune voltage, as can be measured by voltage detector 224, is illustrated by graph 400 in FIG. 4. In one example, the t100% time as illustrated by graph 400 can be measured with sufficient precision to enable calibration module 220 to ascertain the correct response time for PLL 210.

Figure 4:
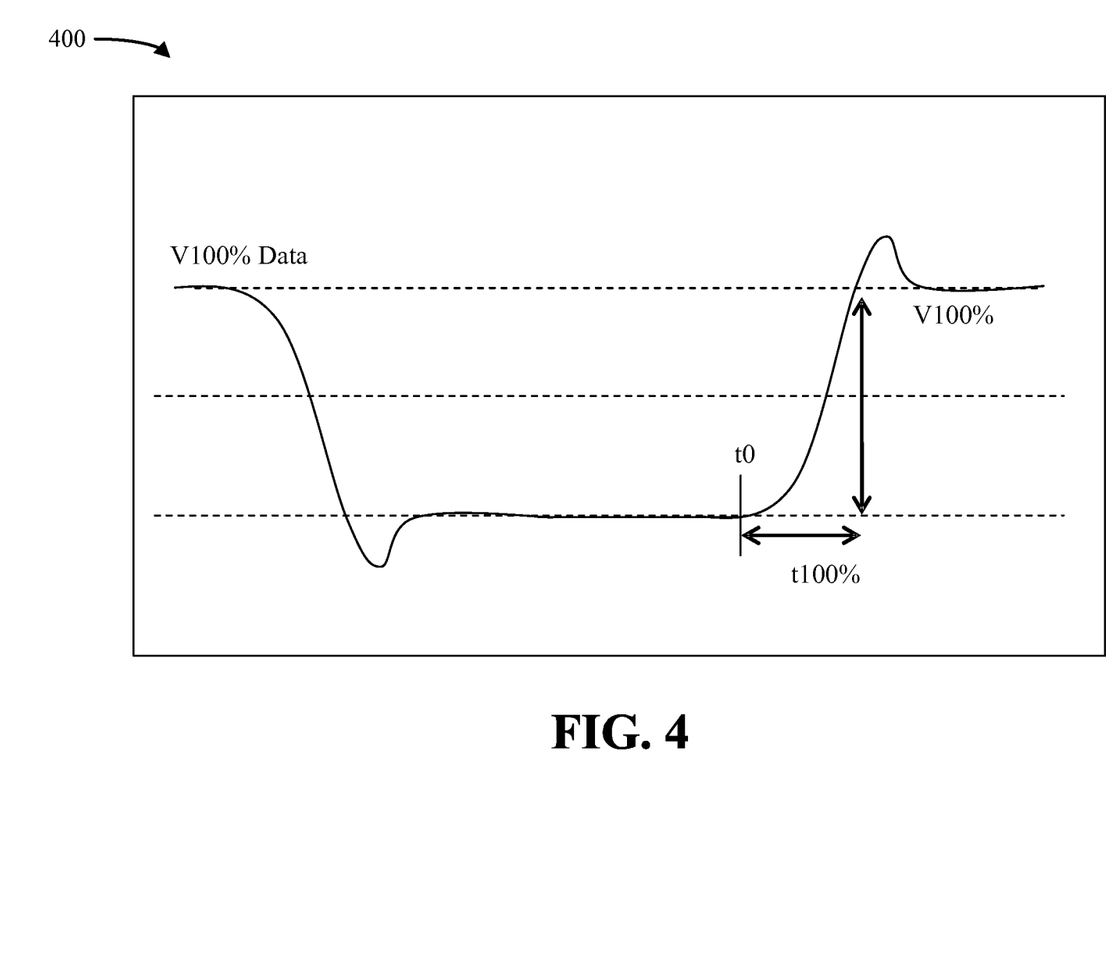

Once the response time for PLL 210 has been measured by calibration module 220 as illustrated by graph 400, the measured time is compared to a goal settling time. In one example, a goal settling time for PLL 210, e.g., PLL_TGoal can be programmable within calibration module 220 and/or stored in memory 230 at calibration module 220. In accordance with one aspect, the goal settling time can be set based on a desired PLL loop bandwidth. Examples of techniques that can be utilized to calculate a goal settling time based on a desired PLL loop bandwidth are described in more detail infra. In another example, a range of acceptable settling time values, e.g., PLL_TRange, can be indicated to cover a predetermined time window greater than and/or less than the goal settling time to provide a compromise between good settling performance and limited Kφ adjustment. The range can be configured, for example, to cover the step size of Kφ in both the positive and negative directions. In one example, the goal settling time and the acceptable range can be specified as a number of counts of a crystal oscillator reference period.

After the t100% time of PLL 210 has been measured and compared to the goal settling time, an appropriate adjustment can be made to $K_\phi$ at PFD/CP 212 by gain adjustment module 228. For example, if the measured t100% time of PLL 210 is less than the goal settling time, $K_\phi$ can be reduced by gain adjustment module 228. Alternatively, if the measured t100% time of PLL 210 is greater than the goal settling time and the maximum acceptable settling time given by $PLL_{13}$ TRange, $K_\phi$ can be increased by gain adjustment module 228. As another alternative, if the measured t100% time of PLL 210 is greater than the goal settling time but within the acceptable settling time range provided by PLL_TRange, calibration can conclude and PFD/CP 212 can be configured to utilize its current $K_\phi$ value. In accordance with one aspect, adjustment of N divider 216 as illustrated by graph 400 and adjustment of $K_\phi$ based on the resulting settling time of PLL 210 can be repeated until an acceptable value of $K_\phi$ is found and/or a predetermined number of iterations have been reached. In one example, a maximum number of iterations can be proportional to a percentage of range in $K_{vco}$ and/or a percentage of starting error in $K_\phi$.

In sum, system 200 and the above description provide techniques for optimizing PLL loop bandwidth. In accordance with one aspect, optimizing PLL loop bandwidth allows tighter control of tradeoffs between phase noise and transient response, which can impact overall wireless system performance. Thus, the techniques described above can be utilized, for example, in connection with a synthesizer that needs to operate in a transient environment where pulling, pushing or frequency disruption exists. Using the above-described techniques, composite loop response can be optimized directly with a single adjustment, minimizing the time required for adjustments. Further, by calibrating PLL loop bandwidth as a closed loop system, rather than calibrating individual blocks and estimating closed loop performance, performance and manufacturing yield for PLLs and/or other suitable structures can be significantly improved.

In accordance with one aspect, calibration techniques that can be performed by calibration module 220, such as those described above, can be automated such that calibration is automatically initiated upon the detection of various conditions that can impact the performance of PLL 210. For example, calibration module 220 can be configured to initiate calibration upon identifying a change in environmental conditions relating to PLL 210 that could affect the performance of PLL 210, such as a change in temperature, a change in humidity, and/or another similar condition relating to the operating environment of PLL 210. Further, calibration module 220 can be configured to initiate calibration upon identifying a change in the operating frequency of PLL 210 and/or one or more other operating characteristics of PLL 210.

Figure 5:
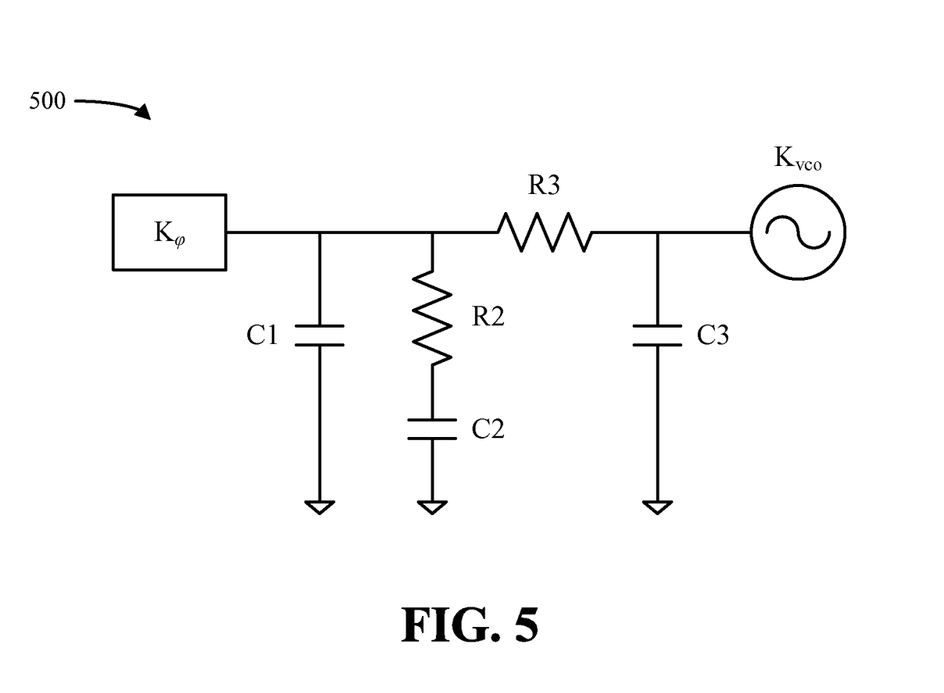
FIG. 5 is a schematic diagram of a loop filter that can be implemented within a phase-locked loop in accordance with various aspects.

FIG. 5 illustrates a loop filter 500 that can be implemented within a phase-locked loop (e.g., PLL 100) in accordance with various aspects. In one example, various properties of loop filter 500 can be utilized to ascertain the expected loop response of a PLL (e.g., the expected t100% time of a PLL for a given loop bandwidth as illustrated by graph 400) as described herein. While FIG. 5 and the following discussion generally relate to a third-order loop filter, it should be appreciated that similar techniques could be utilized for calculating the expected loop response of a PLL that comprises a loop filter of a different order.

In accordance with one aspect, calculation of the expected PLL loop response corresponding to loop filter 500 can begin by deriving a transfer function for loop filter 500. Using matrix notation to indicate Y×V=I, the matrix Y can be written from inspection as follows, where v3 indicates the VCO input node:

$$\begin{bmatrix} \frac{C2s}{R2C2s+1} + C1s + \frac{1}{R3} & \frac{-1}{R3} \\ \frac{-1}{R3} & \frac{1}{R3} + C3s \end{bmatrix} \times \begin{bmatrix} v_\varphi \\ v3 \end{bmatrix} = \begin{bmatrix} I_\varphi \\ 0 \end{bmatrix}. \quad (1)$$

Further, the closed loop response of a PLL associated with loop filter 500 can be given by the following equation:

$$CL(s) := \frac{G(s)}{1 + G(s) \cdot H} \quad (2)$$

where the forward gain G(s) is defined as follows:

$$G(s) := K_\varphi \cdot \frac{K_{vco}}{s} \cdot Z(s), \quad (3)$$

Z(s) is derived from Equation (1) using $$\frac{v_\varphi}{I_\varphi} = Z(s), \text{ and}$$

the feedback term H is defined as follows:

$$H := \frac{1}{N}. \quad (4)$$

By converting CL(s) to a frequency domain equation, the following is obtained:

$$F(s) = s \cdot CL(s) \cdot \frac{(f2 - f1)}{N \cdot s} \quad (5)$$

The roots of Equation (5) can be determined numerically as follows based on the representation of CL(s) given by Equation (2). First, the factored poles can be expanded into partial fractions. Then, utilizing Laplace transforms to F(s), the expected transient response of a PLL associated with loop filter 500 can be calculated using the following equation:

$$f(t) = f2 + \sum_{i=0}^{4} A_i \cdot e^{-p_i \cdot t} \cdot \left( \frac{1}{p_i} + R2 + C2 \right), \quad (6)$$

utilizing the residues $A_i$ for each pole $p_i$.

Figure 6:
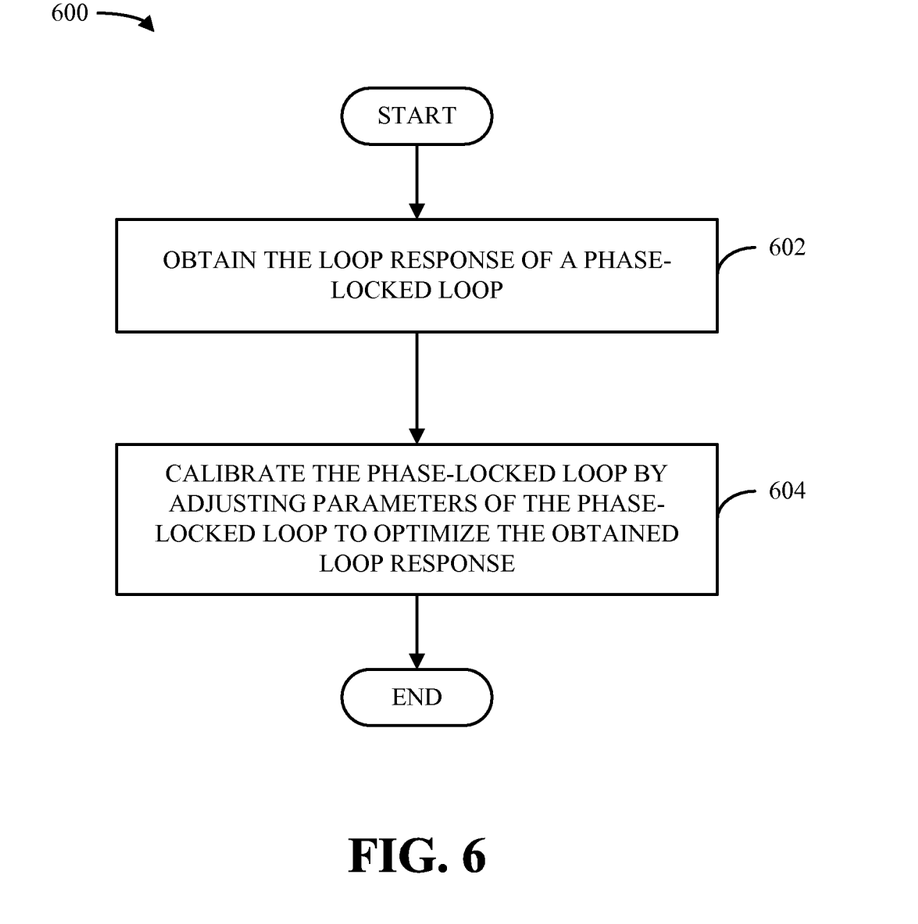
FIG. 6 is a flow diagram of a methodology for calibrating a phase-locked loop in a wireless communication system.
Figure 7:
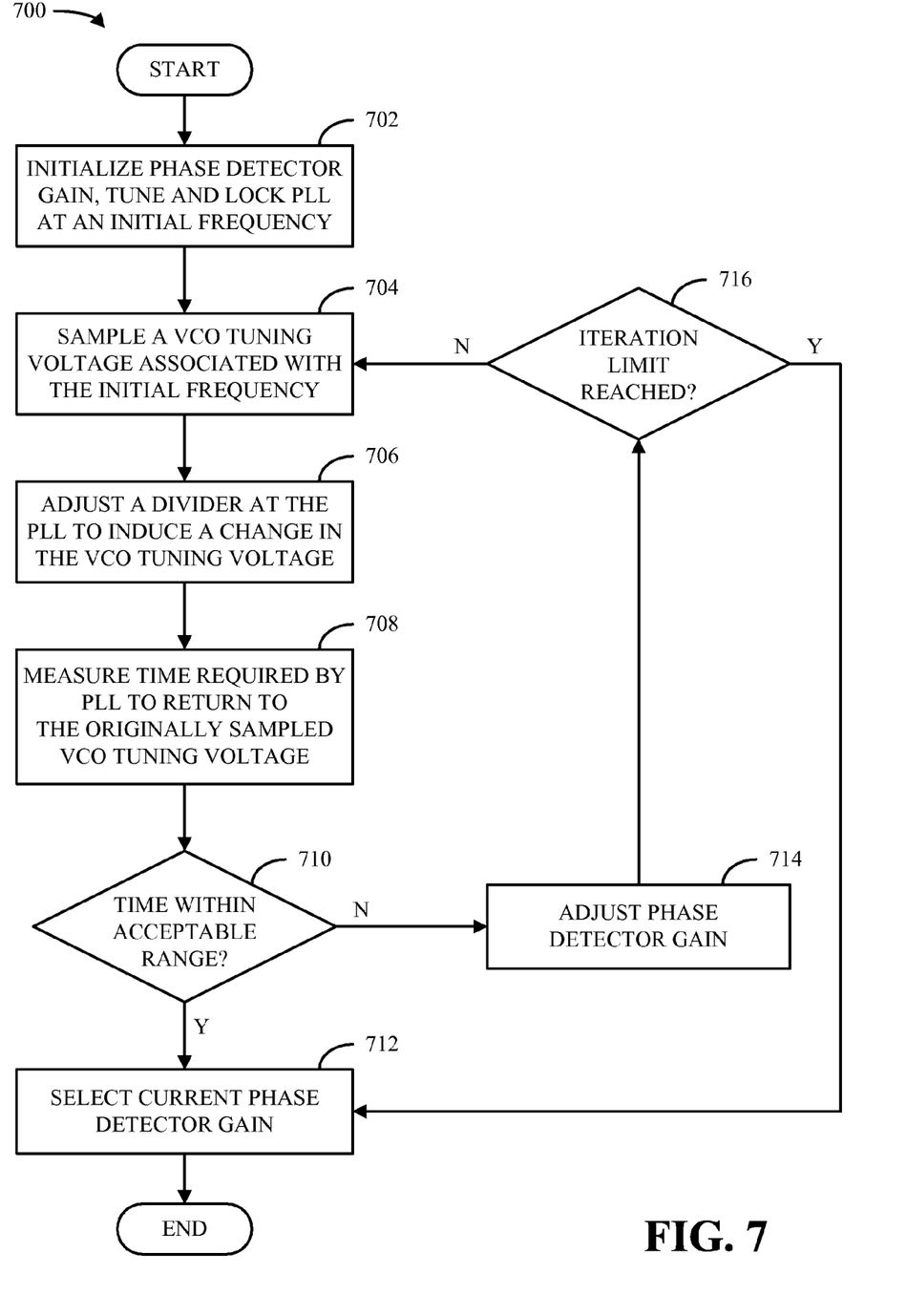
FIG. 7 is a flow diagram of a methodology for adjusting a composite loop bandwidth of a phase-locked loop.

Referring to FIGS. 6-7, methodologies for calibrating the loop bandwidth of a phase-locked loop are illustrated. While, for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

With reference to FIG. 6, illustrated is a methodology 600 for calibrating the loop bandwidth of a phase-locked loop (e.g., PLL 210) in a wireless communication system. It should be appreciated that methodology 600 can be performed at a base station, a mobile station, and/or any other suitable device in a wireless communication system. Methodology 600 begins at block 602, wherein the loop response of a phase-locked loop is obtained. In one example, the loop response of a phase-locked loop can be induced at block 602 by first tuning the input voltage of a voltage-controlled oscillator in the feedback path of the loop to cause the loop to enter a locked state. Once the loop is locked, the loop can then be perturbed by, for example, increasing or decreasing the value of a counter in the feedback path of the loop to cause the input voltage of the voltage-controlled oscillator to change by a small amount. In one example, perturbing the loop can cause the loop to exhibit its loop response, which can then be obtained as described at block 602. For example, the loop response can be obtained by measuring the time required for the voltage-controlled oscillator to settle in response to the new divider value.

Methodology 600 can then continue to block 604, wherein the phase-locked loop is calibrated by adjusting parameters of the phase-locked loop to optimize the loop response obtained at block 602. In one example, calibration at block 604 can be carried out by comparing the time required for the phase-locked loop to settle in response to a changed counter value to an expected settling time. The measured settling time of the phase-locked loop as compared to expected settling time can correspond to, for example, the relative damping of the phase-locked loop. For example, a measured settling time that is greater than the expected time can indicate an overdamped loop, while a measured settling time that is less than the expected time can indicate an underdamped loop. In accordance with one aspect, the phase-locked loop can be calibrated at block 604 based on such a comparison by adjusting parameters of a single component of the loop. For example, calibration at block 604 can be achieved by adjusting a time constant or gain constant of a phase detector in the feedback path of the loop and/or one or more parameters associated with the phase detector or suitable component in the loop.

In accordance with another aspect, the acts performed at blocks 602 and/or 604 of methodology 600 can be repeated over a specified number of iterations and/or as necessary to bring the loop response of the phase-locked loop within a predetermined range of the expected loop response. Further, the operations described with respect to blocks 602 and/or 604 can be automatically performed upon a change in conditions relating to the loop under calibration, a change in frequency utilized by the loop, and/or another suitable change in conditions.

FIG. 7 illustrates a methodology 700 for adjusting a composite loop bandwidth of a phase-locked loop. It should be appreciated that methodology 700 can be performed at a base station, a mobile station, and/or any other suitable device in a wireless communication system. Methodology 700 begins at block 702, wherein the gain of a phase detector in the feedback path of the phase-locked loop under calibration (e.g., PFD/CP 212 at PLL 210) is initialized and the phase-locked loop is locked at an initial frequency. Next, at block 704, a VCO tuning voltage associated with the initial frequency (e.g., a Vtune voltage) is sampled (e.g., by voltage detector 224 at calibration module 220). At block 706, a divider in the feedback path of the loop under calibration (e.g., N divider 216) is adjusted (e.g., by divider adjustment module 222) to induce a change in the voltage sampled at block 704. Methodology 700 then continues to block 708, wherein the time required by the phase-locked loop to return to the original voltage sampled at block 704 (e.g., the t100% time as illustrated by graph 400) is measured (e.g., by timer module 226).

At block 710, it is then determined whether the time measured at block 708 is within an acceptable range. If the measured time is within the acceptable range, methodology 700 concludes at block 712, wherein the currently configured gain of the phase detector at the loop under calibration is selected. Otherwise, methodology 700 continues to block 714, wherein the phase detector gain is adjusted (e.g., by gain adjustment module 228). In one example, adjustments made to the phase detector gain at block 714 can be upward or downward adjustments based on the time measured at block 708 in relation to the acceptable range. For example, a downward adjustment to the phase detector gain can be performed at block 714 if the time measured at block 708 is below the acceptable range, and an upward adjustment can be performed at block 714 if the time measured at block 708 is above the acceptable range.

Upon completing the act described at block 714, methodology 700 can continue to block 716, wherein it is determined whether an iteration limit has been reached. In accordance with one aspect, a limit on the number of adjustments to the phase detector gain that can be performed at block 714 can be imposed and enforced at block 716. If this limit has been reached, methodology can proceed to block 712 to select the current gain of the phase detector and conclude. Alternatively, if the iteration limit has not been reached at block 716 or an iteration limit is not being enforced for methodology 700, methodology 700 can return to block 704 to repeat calibration.

Figure 8:
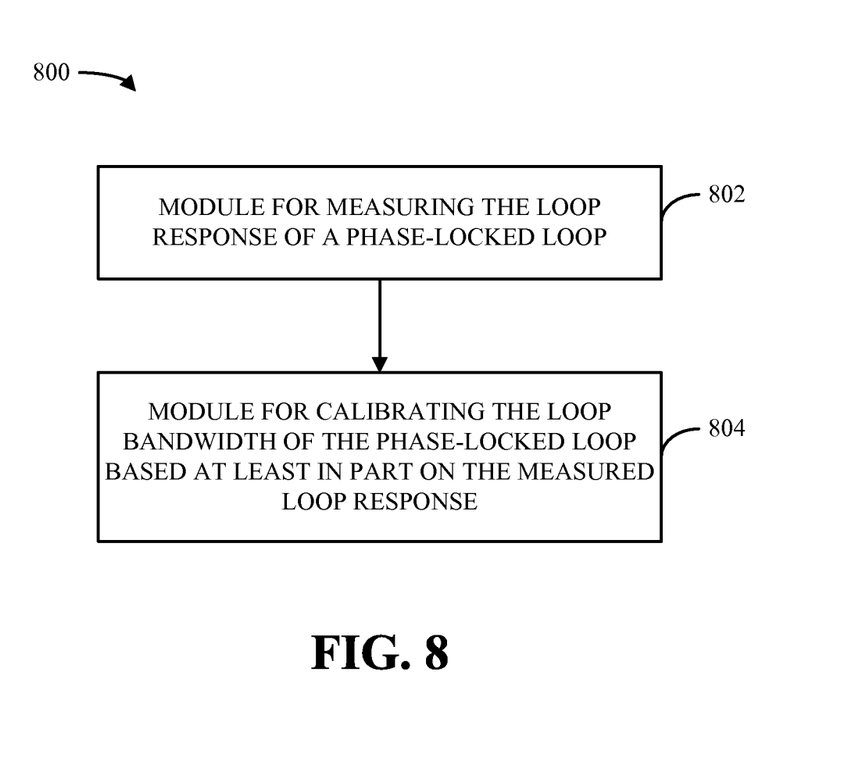
FIG. 8 is a block diagram of an apparatus that facilitates loop bandwidth calibration for a phase-locked loop in a wireless communication system.

FIG. 8 illustrates an apparatus 800 that facilitates loop bandwidth calibration for a phase-locked loop in a wireless communication system. It is to be appreciated that apparatus 800 is represented as including functional blocks, which can be functional blocks that represent functions implemented by a processor, software, or combination thereof (e.g., firmware). Apparatus 800 can be implemented in a base station, a mobile terminal, and/or another suitable network entity and can include a module 802 for measuring the loop response of a phase-locked loop and a module 804 for calibrating the loop bandwidth of the phase-locked loop based at least in part on the measured loop response.

Figure 9:
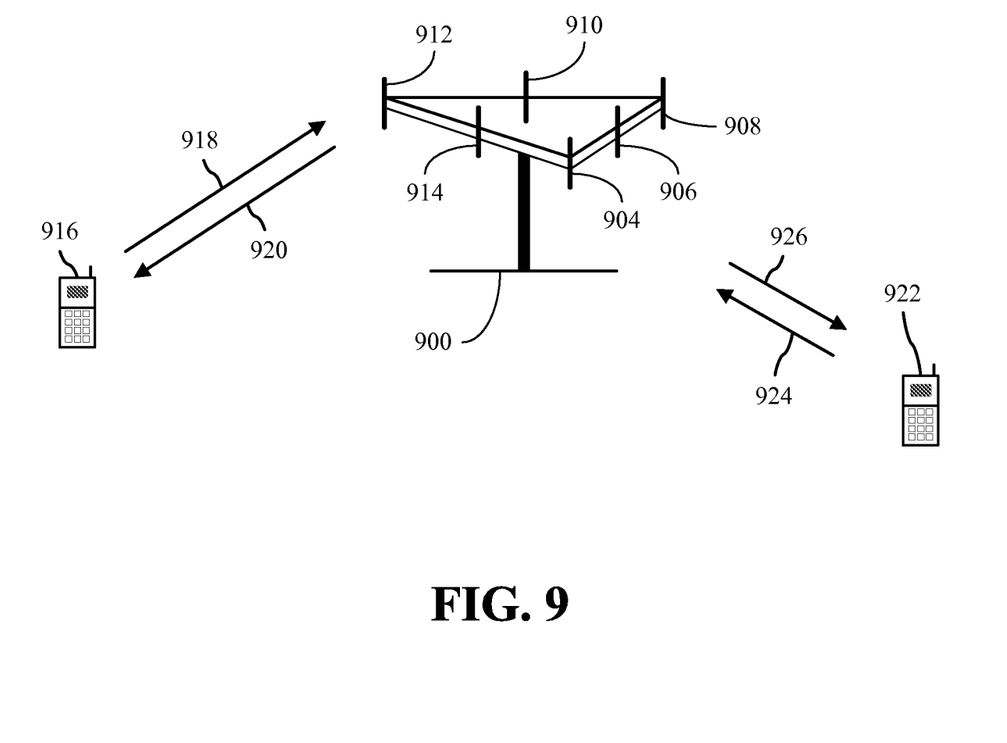
FIG. 9 illustrates a wireless multiple-access communication system in accordance with various aspects set forth herein.

Referring now to FIG. 9, an illustration of a wireless multiple-access communication system in accordance with various aspects is provided. In one example, an access point 900 (AP) includes multiple antenna groups. As illustrated in FIG. 9, one antenna group can include antennas 904 and 906, another can include antennas 908 and 910, and another can include antennas 912 and 914. While only two antennas are shown in FIG. 9 for each antenna group, it should be appreciated that more or fewer antennas may be utilized for each antenna group. In another example, an access terminal 916 (AT) can be in communication with antennas 912 and 914, where antennas 912 and 914 transmit information to access terminal 916 over forward link 920 and receive information from access terminal 916 over reverse link 918. Additionally and/or alternatively, access terminal 922 can be in communication with antennas 906 and 908, where antennas 906 and 908 transmit information to access terminal 922 over forward link 926 and receive information from access terminal 922 over reverse link 924. In a frequency division duplex (FDD) system, communication links 918, 920, 924 and 926 can use different frequency for communication. For example, forward link 920 may use a different frequency then that used by reverse link 918.

Each group of antennas and/or the area in which they are designed to communicate can be referred to as a sector of the access point. In accordance with one aspect, antenna groups can be designed to communicate to access terminals in a sector of areas covered by access point 900. In communication over forward links 920 and 926, the transmitting antennas of access point 900 can utilize beamforming in order to improve the signal-to-noise ratio of forward links for the different access terminals 916 and 922. Also, an access point using beamforming to transmit to access terminals scattered randomly through its coverage causes less interference to access terminals in neighboring cells than an access point transmitting through a single antenna to all its access terminals.

An access point, e.g., access point 900, can be a fixed station used for communicating with terminals and can also be referred to as a base station, a Node B, an access network, and/or other suitable terminology. In addition, an access terminal, e.g., an access terminal 916 or 922, can be a fixed or mobile station for communicating with access points and can be referred to as a mobile terminal, user equipment (UE), a wireless communication device, a terminal, a wireless terminal, and/or other appropriate terminology.

Figure 10:
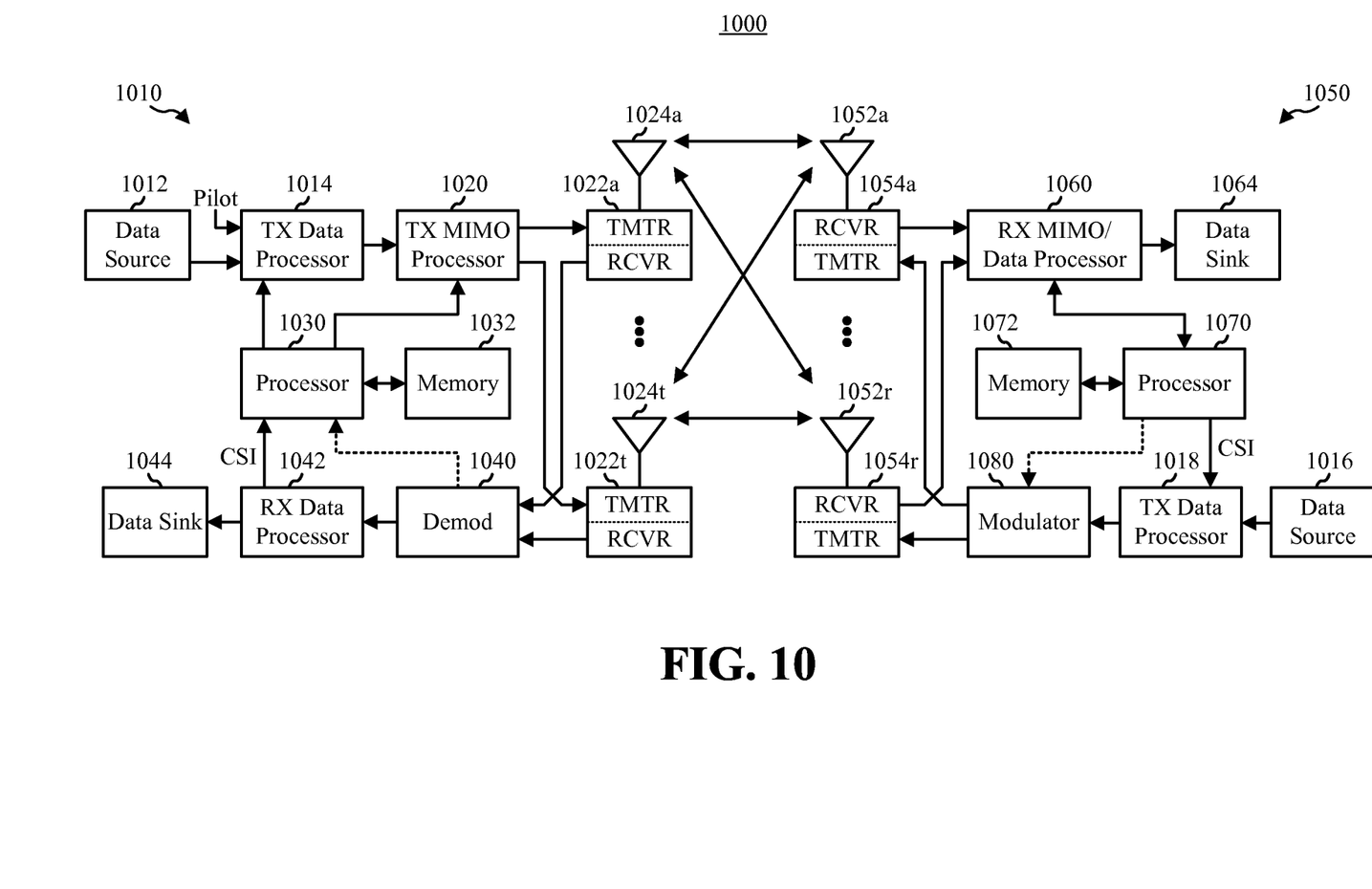
FIG. 10 is a block diagram illustrating an example wireless communication system in which one or more aspects described herein may function.

Referring now to FIG. 10, a block diagram illustrating an example wireless communication system 1000 in which one or more embodiments described herein can function is provided. In one example, system 1000 is a multiple-input multiple-output (MIMO) system that includes a transmitter system 1010 and a receiver system 1050. It should be appreciated, however, that transmitter system 1010 and/or receiver system 1050 could also be applied to a multi-input single-output (MISO) system wherein, for example, multiple transmit antennas (e.g., on a base station), can transmit one or more symbol streams to a single antenna device (e.g., a mobile station). Additionally, it should be appreciated that aspects of transmitter system 1010 and/or receiver system 1050 described herein could be utilized in connection with a single output to single input (SISO) antenna system.

In accordance with one aspect, traffic data for a number of data streams are provided at transmitter system 1010 from a data source 1012 to a transmit (TX) data processor 1014. In one example, each data stream can then be transmitted via a respective transmit antenna 1024. Additionally, TX data processor 1014 can format, code, and interleave traffic data for each data stream based on a particular coding scheme selected for each respective data stream in order to provide coded data. In one example, the coded data for each data stream can then be multiplexed with pilot data using OFDM techniques. The pilot data can be, for example, a known data pattern that is processed in a known manner. Further, the pilot data can be used at receiver system 1050 to estimate channel response. Back at transmitter system 1010, the multiplexed pilot and coded data for each data stream can be modulated (i.e., symbol mapped) based on a particular modulation scheme (e.g., BPSK, QSPK, M-PSK, or M-QAM) selected for each respective data stream in order to provide modulation symbols. In one example, data rate, coding, and modulation for each data stream can be determined by instructions performed on and/or provided by processor 1030.

Next, modulation symbols for all data streams can be provided to a TX processor 1020, which can further process the modulation symbols (e.g., for orthogonal frequency division multiplexing or OFDM). TX MIMO processor 1020 can then provides NT modulation symbol streams to NT transceivers 1022a through 1022t. In one example, each transceiver 1022 can receive and process a respective symbol stream to provide one or more analog signals. Each transceiver 1022 can then further condition (e.g., amplify, filter, and upconvert) the analog signals to provide a modulated signal suitable for transmission over a MIMO channel. Accordingly, NT modulated signals from transceivers 1022a through 1022t can then be transmitted from NT antennas 1024a through 1024t, respectively.

In accordance with another aspect, the transmitted modulated signals can be received at receiver system 1050 by NR antennas 1052a through 1052r. The received signal from each antenna 1052 can then be provided to respective transceivers 1054. In one example, each transceiver 1054 can condition (e.g., filter, amplify, and downconvert) a respective received signal, digitize the conditioned signal to provide samples, and then processes the samples to provide a corresponding "received" symbol stream. An RX MIMO/data processor 1060 can then receive and process the NR received symbol streams from NR transceivers 1054 based on a particular receiver processing technique to provide NT "detected" symbol streams. In one example, each detected symbol stream can include symbols that are estimates of the modulation symbols transmitted for the corresponding data stream. RX processor 1060 can then process each symbol stream at least in part by demodulating, deinterleaving, and decoding each detected symbol stream to recover traffic data for a corresponding data stream. Thus, the processing by RX processor 1060 can be complementary to that performed by TX MIMO processor 1020 and TX data processor 1014 at transmitter system 1010. RX processor 1060 can additionally provide processed symbol streams to a data sink 1064.

In accordance with one aspect, the channel response estimate generated by RX processor 1060 can be used to perform space/time processing at the receiver, adjust power levels, change modulation rates or schemes, and/or other appropriate actions. Additionally, RX processor 1060 can further estimate channel characteristics such as, for example, signal-to-noise-and-interference ratios (SNRs) of the detected symbol streams. RX processor 1060 can then provide estimated channel characteristics to a processor 1070. In one example, RX processor 1060 and/or processor 1070 can further derive an estimate of the "operating" SNR for the system. Processor 1070 can then provide channel state information (CSI), which can comprise information regarding the communication link and/or the received data stream. This information can include, for example, the operating SNR. The CSI can then be processed by a TX data processor 1018, modulated by a modulator 1080, conditioned by transceivers 1054a through 1054r, and transmitted back to transmitter system 1010. In addition, a data source 1016 at receiver system 1050 can provide additional data to be processed by TX data processor 1018.

Back at transmitter system 1010, the modulated signals from receiver system 1050 can then be received by antennas 1024, conditioned by transceivers 1022, demodulated by a demodulator 1040, and processed by a RX data processor 1042 to recover the CSI reported by receiver system 1050. In one example, the reported CSI can then be provided to processor 1030 and used to determine data rates as well as coding and modulation schemes to be used for one or more data streams. The determined coding and modulation schemes can then be provided to transceivers 1022 for quantization and/or use in later transmissions to receiver system 1050. Additionally and/or alternatively, the reported CSI can be used by processor 1030 to generate various controls for TX data processor 1014 and TX MIMO processor 1020. In another example, CSI and/or other information processed by RX data processor 1042 can be provided to a data sink 1044.

In one example, processor 1030 at transmitter system 1010 and processor 1070 at receiver system 1050 direct operation at their respective systems. Additionally, memory 1032 at transmitter system 1010 and memory 1072 at receiver system 1050 can provide storage for program codes and data used by processors 1030 and 1070, respectively. Further, at receiver system 1050, various processing techniques can be used to process the NR received signals to detect the NT transmitted symbol streams. These receiver processing techniques can include spatial and space-time receiver processing techniques, which can also be referred to as equalization techniques, and/or "successive nulling/equalization and interference cancellation" receiver processing techniques, which can also be referred to as "successive interference cancellation" or "successive cancellation" receiver processing techniques.

It is to be understood that the aspects described herein can be implemented by hardware, software, firmware, middleware, microcode, or any combination thereof When the systems and/or methods are implemented in software, firmware, middleware or microcode, program code or code segments, they can be stored in a machine-readable medium, such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

What has been described above includes examples of one or more aspects. It is, of course, not possible to describe every conceivable combination of components or methodologies for purposes of describing the aforementioned aspects, but one of ordinary skill in the art can recognize that many further combinations and permutations of various aspects are possible. Accordingly, the described aspects are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim. Furthermore, the term "or" as used in either the detailed description or the claims is meant to be a "non-exclusive or.

What is claimed is:

1. A method for adjusting a composite loop bandwidth of a phase-locked loop (PLL), comprising:

causing the PLL to exhibit a loop response;
measuring the loop response exhibited by the PLL;
modifying and restoring a value of a feedback counter of the PLL to cause a change in the loop response and a return to the measured loop response;
measuring an amount of settling time required by the PLL to return to the measured loop response;
comparing the amount of settling time to a goal settling time and identifying a difference in settling time;
determining a relationship between the difference in settling time and an offset to a phase frequency detector gain of the PLL; and
adjusting the phase frequency detector gain by the offset to optimize the measured loop response and the composite loop bandwidth of the PLL and reduce the difference in settling time.

2. The method of claim 1, wherein the causing comprises:
tuning a voltage-controlled oscillator (VCO) in the PLL to an initial frequency;
locking the PLL at the initial frequency;
sampling a tuning voltage of the VCO;
modifying a value of a feedback counter of the PLL from a first value to a second value to cause a change in the tuning voltage; and
modifying the value of the feedback counter back from the second value to the first value to cause the tuning voltage to return to the sampled tuning voltage.

3. The method of claim 2, wherein the sampling a tuning voltage comprises sampling a tuning voltage of the PLL at an output of a loop filter of the PLL.

4. The method of claim 2, wherein the measuring further comprises measuring an amount of settling time required by the PLL to return to the sampled tuning voltage.

5. The method of claim 4, wherein the comparing comprises determining whether the amount of settling time is within an acceptable range of the goal settling time and the adjusting the phase frequency detector gain comprises adjusting the phase frequency detector gain by the offset in response to the amount of settling time being outside the acceptable range of the goal settling time.

6. The method of claim 1, wherein the adjusting comprises adjusting a gain constant of a VCO at the PLL in addition to adjusting the phase frequency detector gain by the offset.

7. The method of claim 1, further comprising repeating the causing, measuring, and adjusting until a desired composite loop bandwidth is reached.

8. The method of claim 1, further comprising:
determining whether a maximum number of adjustments to the phase frequency detector gain has been reached; and
repeating the causing, measuring, and adjusting if a desired composite loop bandwidth has not been reached and the maximum number of adjustments has not been reached.

9. The method of claim 1, further comprising:
identifying a change in conditions that impact performance of the PLL; and
performing the causing, measuring, and adjusting in response to identifying the change in conditions.

10. The method of claim 9, wherein the identifying comprises identifying a change in an operating frequency of the PLL.

11. The method of claim 9, wherein the identifying comprises identifying a change in an environmental condition relating to the PLL.

12. The method of claim 1, wherein the causing, measuring, and adjusting are implemented using one semiconductor device.

13. A wireless communications apparatus, comprising:
a memory that stores data relating to a PLL and a time constant related to loop response of the PLL; and
a processor configured to induce a loop response of the PLL, measure the induced loop response, and to optimize the loop response by adjusting and restoring a value of a divider in the PLL and measuring a change in the time constant of the PLL based at least in part on the induced loop response and the adjusting and restoring the value of the divider.

14. The wireless communications apparatus of claim 13, wherein the memory further stores data relating to an initial frequency, a first counter value, and a second counter value; and the processor is further configured to induce the loop response of the PLL at least in part by locking the PLL at the initial frequency, storing a tuning voltage of a VCO in the PLL associated with the initial frequency in the memory, wherein adjusting and restoring the value of the divider comprises changing a value of the divider in the PLL from the first counter value to the second counter value to cause a change in the tuning voltage of the VCO, and returning the value of the divider to the first counter value to cause the tuning voltage of the VCO to return to the stored tuning voltage.

15. The wireless communications apparatus of claim 14, wherein the processor is configured to obtain the tuning voltage of the VCO by sampling an output voltage of a loop filter of the PLL.

16. The wireless communications apparatus of claim 14, wherein the processor is configured to measure the induced loop response at least in part by identifying a rise time required by the PLL to return to the stored tuning voltage.

17. The wireless communications apparatus of claim 16, wherein the memory further stores data relating to an expected rise time and the processor is further configured to compare the identified rise time to the expected rise time and to perform an appropriate modification of a phase constant of the PLL based on the comparison.

18. The wireless communications apparatus of claim 17, wherein the memory further stores data relating to a range for the expected rise time and the processor is further configured to determine whether the identified rise time is within the range and to modify the phase constant of the PLL upon a determination that the identified rise time is not within the range.

19. The wireless communications apparatus of claim 18, wherein the processor is further configured to adjust the time constant of the PLL downward if the identified rise time is below the range for the expected rise time.

20. The wireless communications apparatus of claim 18, wherein the processor is further configured to adjust the time constant of the PLL upward if the identified rise time is above the range for the expected rise time.

21. The wireless communications apparatus of claim 13, wherein the processor is further configured to repeat adjustment to the time constant of the PLL to arrive at a time constant that provides a desired composite loop bandwidth.

22. The wireless communications apparatus of claim 13, wherein the memory further stores data relating to an iteration limit for adjustments to the time constant of the PLL and the processor is further configured to determine whether the iteration limit has been reached upon adjusting the time constant of the PLL and to repeat adjustment of the time constant upon a determination that the iteration limit has not been reached.

23. The wireless communications apparatus of claim 13, wherein the processor is further configured to identify a change in operating conditions of the PLL and to adjust the time constant of the PLL upon identifying the change in operating conditions.

24. The wireless communications apparatus of claim 23, wherein the change in operating conditions is a change in an operating frequency of the PLL.

25. The wireless communications apparatus of claim 23, wherein the change in operating conditions is one or more of a change in temperature of an operating environment of the PLL or a change in humidity of the operating environment of the PLL.

26. An apparatus that facilitates calibration of a PLL in a wireless communication system, comprising:
　means for inducing a loop response of the PLL at least in part by modifying one or more parameters relating to a divider in a feedback path of the PLL;
　means for measuring a response time associated with the loop response of the PLL; and
　means for adjusting a parameter of an element of the PLL to cause the PLL to operate at a desired loop bandwidth, wherein a magnitude of adjustment of the parameter is derived at least in part from the response time.

27. A non-transitory computer-readable medium, comprising:
　code for causing a computer to modify a feedback counter of a PLL;
　code for causing a computer to measure an amount of settling time required by the PLL to settle as a result of the modification of the feedback counter; and
　code for causing a computer to adjust loop bandwidth of the PLL at least in part by adjusting one or more parameters of an element in the PLL based on the measured amount of settling time.

28. An integrated circuit that executes computer-executable instructions for adjusting a loop bandwidth of a PLL, the instructions comprising:
　tuning a VCO in the PLL to a desired frequency;
　locking the PLL at the desired frequency;
　recording a tuning voltage of the VCO associated with the desired frequency;
　changing a value of a feedback counter of the PLL from a first value to a second value to cause a change in the tuning voltage of the VCO;
　changing the value of the feedback counter back to the first value and measuring a settling time required by the VCO to return to the recorded tuning voltage; and
　adjusting a time constant of the PLL to provide a desired loop bandwidth for the PLL, wherein a time constant adjustment is derived at least in part from the measured settling time.

\* \* \* \* \*